US006760981B2

(12) United States Patent
Leap

(10) Patent No.: US 6,760,981 B2
(45) Date of Patent: Jul. 13, 2004

(54) COMPACT CONVECTION DRYING CHAMBER FOR DRYING PRINTED CIRCUIT BOARDS AND OTHER ELECTRONIC ASSEMBLIES BY ENHANCED EVAPORATION

(75) Inventor: Gerald Leap, Tunas, MO (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 10/051,213

(22) Filed: Jan. 18, 2002

(65) Prior Publication Data

US 2003/0136019 A1 Jul. 24, 2003

(51) Int. Cl.⁷ .............................................. F26B 19/00
(52) U.S. Cl. ............................ 34/210; 34/212; 34/219
(58) Field of Search .......................... 34/549, 552–554, 34/83, 84, 107, 201, 202, 209–212, 215–221, 223–225, 230–233

(56) References Cited

U.S. PATENT DOCUMENTS

| 2,884,711 | A |   | 5/1959  | Parkes             |         |
|-----------|---|---|---------|--------------------|---------|
| 3,579,853 | A |   | 5/1971  | Martino            |         |
| 4,077,467 | A | * | 3/1978  | Spigarelli         | 34/75   |
| 4,321,031 | A | * | 3/1982  | Woodgate           | 432/11  |
| 4,361,967 | A |   | 12/1982 | Bahnsen et al.     |         |
| 4,523,391 | A |   | 6/1985  | Smith et al.       |         |
| 4,996,781 | A | * | 3/1991  | Mishina et al.     | 34/74   |
| 4,996,939 | A |   | 3/1991  | D'Amato            | 118/65  |
| 5,154,010 | A |   | 10/1992 | Klemm              |         |
| 5,384,969 | A |   | 1/1995  | Troetscher et al.  |         |
| 5,462,599 | A |   | 10/1995 | Kuster             | 118/503 |

(List continued on next page.)

FOREIGN PATENT DOCUMENTS

| DE | 23 44 227     |    | 3/1975  |              |
|----|---------------|----|---------|--------------|
| DE | 41 39 860 A1  | *  | 6/1992  | ... F26B/3/06 |
| EP | 0 582 920 A2  |    | 2/1994  | ... H05K/3/00 |
| EP | 0 582 920     |    | 2/1994  |              |
| FR | 990 108       |    | 9/1951  |              |
| FR | 990.108       |    | 9/1951  |              |
| FR | 2 640 737     |    | 6/1990  |              |
| GB | 1 517 189     |    | 7/1978  |              |
| GB | 2 244 122 A   | *  | 11/1991 | ... F26B/9/06 |

OTHER PUBLICATIONS

International Search Report for PCT/US 03/01500 mailed on May 13, 2003.

*Primary Examiner*—Henry Bennett
*Assistant Examiner*—Andrea M. Ragonese
(74) *Attorney, Agent, or Firm*—Lowrie, Lando & Anastasi, LLP

(57) ABSTRACT

The invention provides a compact drying chamber for drying printed circuit boards and electronic connectors and components mounted thereto by enhanced evaporation to remove residual water and completely dry printed circuit boards. The compact drying chamber comprises features that help maximize a velocity at which heated air impacts printed circuit boards to significantly enhance evaporation from surfaces of printed circuit boards and to raise the temperature of electronic connectors and components to allow evaporation therefrom, while maintaining low power consumption with respect to heating and circulating air. The compact drying chamber also comprises features that help maximize a dwell time of printed circuit boards in high velocity heated air within practical conveyance speeds, while maintaining overall dimensions that allow a compact design. The compact drying chamber further comprises features that recirculate air, minimize heat loss, minimize exhaust requirements and keep manufacturing and operation costs low.

27 Claims, 7 Drawing Sheets

U.S. PATENT DOCUMENTS

| | | | |
|---|---|---|---|
| 5,529,081 A | 6/1996 | Kappler | 134/64 |
| 5,553,633 A | 9/1996 | Ciccarelli, Jr. et al. | 134/72 |
| 5,611,476 A | 3/1997 | Soderlund et al. | 228/42 |
| 5,617,647 A * | 4/1997 | Okane et al. | 34/218 |
| 5,761,829 A | 6/1998 | Dallera | 34/660 |
| 5,785,233 A | 7/1998 | Nutter et al. | 228/46 |
| 5,795,146 A | 8/1998 | Orbeck | 432/176 |
| 5,814,789 A * | 9/1998 | O'Leary et al. | 219/388 |
| 5,852,879 A * | 12/1998 | Schumaier | 34/80 |
| 5,911,486 A * | 6/1999 | Dow et al. | 34/74 |
| 5,913,589 A | 6/1999 | Dow et al. | 34/378 |
| 6,051,421 A * | 4/2000 | Sauer et al. | 435/283.1 |
| 6,115,939 A | 9/2000 | Kuster | 34/194 |
| 6,159,294 A | 12/2000 | Kuster et al. | 118/642 |
| 6,270,305 B1 | 8/2001 | Orbeck et al. | 414/157 |
| 6,282,812 B1 | 9/2001 | Wee et al. | |
| 6,354,481 B1 * | 3/2002 | Rich et al. | 228/19 |
| 6,444,035 B1 * | 9/2002 | Nowak et al. | 118/684 |

* cited by examiner

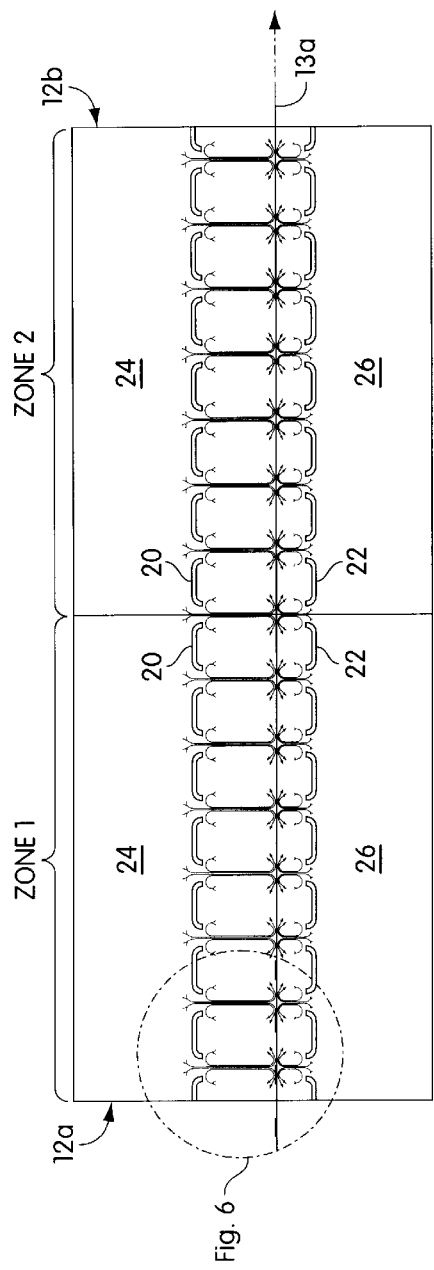
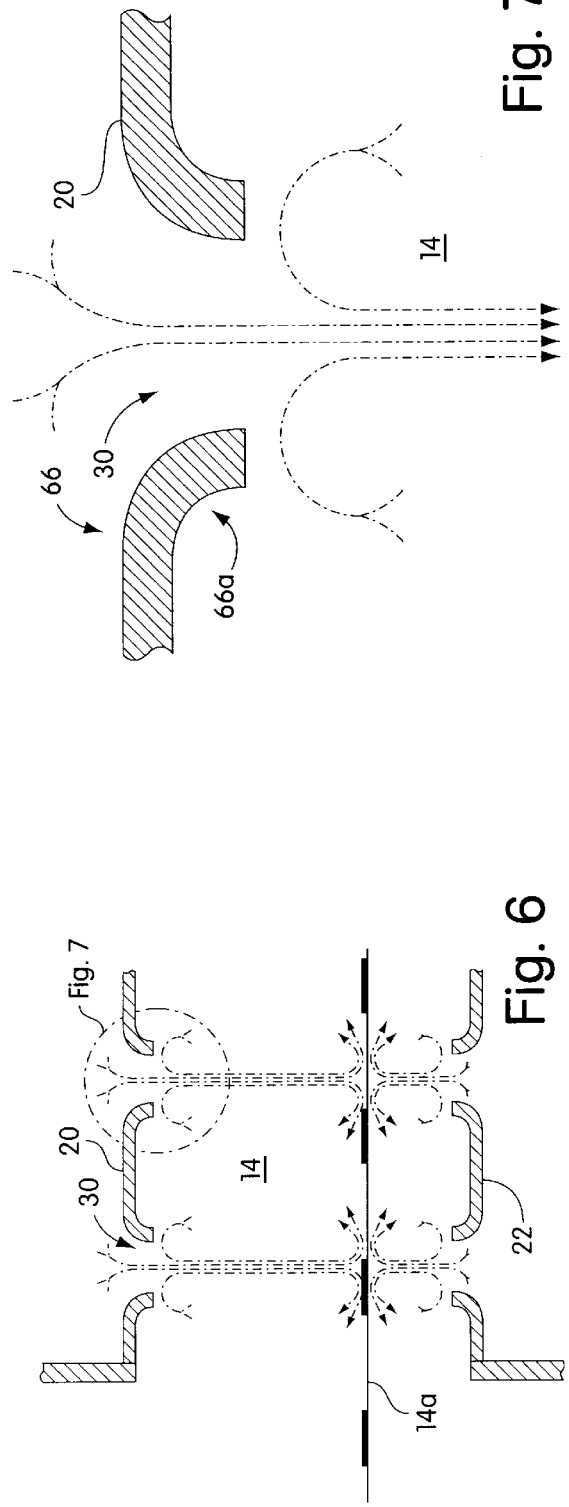

COMPACT CONVECTION DRYING CHAMBER FOR DRYING PRINTED CIRCUIT BOARDS AND OTHER ELECTRONIC ASSEMBLIES BY ENHANCED EVAPORATION

FIELD OF THE INVENTION

The invention is generally directed to a compact drying chamber for drying articles by convection heating. More specifically, the invention provides a compact drying chamber for drying printed circuit boards and other electronic assemblies by enhancing evaporation. The compact drying chamber of the invention provides high velocity convection-heated air and maximizes dwell time of printed circuit boards within heated air to achieve enhanced rates of evaporation.

BACKGROUND OF THE INVENTION

In the field of manufacturing printed circuit boards and electronic assemblies, prior art systems and apparatuses provide various treatments of printed circuit boards such as reflow or wave soldering, etching, and cleaning that are typically followed by rinsing and drying processes. Printed circuit boards are typically cleansed in water-based cleaning systems and then subsequently dried in various types of dryers and drying systems that employ air. Many prior art designs supply air to printed circuit boards at high velocity (typically >10,000 fpm) to physically remove the bulk of residual water from the surfaces of printed circuit boards and to dry boards by evaporation. Air is typically delivered by a number of discrete air nozzles, air knives or other devices as high velocity heated air streams through which printed circuit boards pass during the drying process.

High velocity air streams striking printed circuit boards blows off the bulk of exposed water residing on the surfaces of boards after cleansing and breaks up such water into small and fine water droplets that are eventually removed by evaporation. Although striking boards with high velocity air readily removes the bulk of residual water on printed circuit boards, the impact breaks water into very small and fine water droplets that are difficult to physically remove from printed circuit boards due to their high surface tension. A layer of air at an intermediate temperature forms between small water droplets and the surrounding air, which produces an insulating or "skin" effect that reduces a rate of heat exchange. Impinging small and fine water droplets with high velocity heated air disrupts this "skin" effect and enables water to be removed by evaporation.

In addition, small and fine water droplets residing in or around the different types of electronic connectors and components connected or surface-mounted to printed circuit boards are often hidden and essentially removed from the path or flow of heated air. Small and fine water droplets also reside or pool within narrow or deep recesses of electronic connectors and components and, thus, are not sufficiently exposed to the heated airflow. Heated air streams simply cannot reach small and fine water droplets embedded within such electronic connectors and components. Such small and fine water droplets will eventually be removed by evaporation as the temperature of printed circuit boards and electronic connectors and components is raised and maintained upon continued exposure to heated air. However, evaporation takes place at the interface of heated air and water. Since such small and fine water droplets have little or no contact with heated airflow in comparison to their volume, removal of water from electronic connectors and components by evaporation alone would take too long.

At practical speeds of conveyance provided by many prior art dryer designs, the time printed circuit boards are exposed to high velocity heated air, or the dwell time, is insufficient or too short to completely dry printed circuit boards by evaporation. Thus, reliance upon evaporation alone to remove small and fine water droplets from surfaces of printed circuit boards and electronic connectors and components to completely dry boards requires an increase in the dwell time. The more time each point along the surfaces of printed circuit boards is exposed to heated air, the faster the rate of heat exchange and the faster the temperature of printed circuit boards and electronic connectors and components is raised to a sufficient degree to enhance evaporation of water. Hence, the longer the dwell time, the more completely printed circuit boards are dried.

Many prior art dryer designs that employ high velocity heated air increase the dwell time of printed circuit boards by increasing the number of air nozzles or air knives in order to increase the streams or jets of high velocity heated air through which printed circuit boards pass during drying. However, an increase in the number of air nozzles or air knives requires one or more large air blowers and a delivery system to effectively pressurize and circulate a sufficient volume of heated air through a large number of nozzles or knives. Use of large air blowers to accommodate the required output typically results in a substantial increase in the size of the dryer and an increase in the dryer's power consumption and exhaust requirements. In addition, high power blowers are often limited to intake temperatures of about 125° C., which requires cool air to be added to the blowers' intake, which increases the exhaust requirements of the dryer. For instance, one prior art design employs a large number of discrete air knifes to increase dwell time that requires a twelve foot drying chamber through which printed circuit boards are conveyed to be completely dried. This dryer design is effective in drying printed circuit boards. However, its disadvantages are its large size and high power consumption. In addition, such large dryer designs operate at high noise levels. Another prior art design increases the dwell time of printed circuit boards by delivering a large volume of heated air on the order of about 3,000 cfm at a high velocity that requires three 15 hp air blowers and does not recirculate air. The disadvantages of this dryer design are its very high power consumption and exhaust requirements. Thus, prior art designs that use a large number of air nozzles or air knives and/or a large volume of heated air to lengthen the dwell time of printed circuit boards result in very large dryers and drying systems with high power consumption and high exhaust requirements. Such dryer designs are also expensive to manufacture and operate.

Therefore, it is desirable to provide a dryer or a drying system with the capability of rapidly heating printed circuit boards and particularly electronic connectors and components connected or mounted thereto to efficiently and completely dry printed circuit boards by an enhanced rate of evaporation without substantially increasing the size of the dryer or drying system, its power consumption, exhaust requirements and manufacturing and operating costs.

SUMMARY OF THE INVENTION

The invention provides a compact drying chamber for drying printed circuit boards and the different types of electronic connectors and components connected or surface-mounted thereto by convection heating after printed circuit boards have been washed or otherwise processed. Embodiments of the compact drying chamber according to the invention dry printed circuit boards and electronic connectors and components by enhanced evaporation that removes residual water otherwise difficult or impossible to physically remove by heated air streams. Embodiments of the compact drying chamber according to the invention overcome the limitations and disadvantages of prior art dryer designs with respect to overall size, power consumption, exhaust requirements and manufacturing and operating costs.

The invention provides a compact drying chamber comprising features that control the parameters found to significantly affect a rate of evaporation and, consequently, affect a rate at which printed circuit boards are completely dried by evaporation. Such parameters include the velocity at which heated air impacts surfaces of printed circuit boards, the dwell time or the time printed circuit boards are exposed to heated air, and the temperature of the heated air provided to printed circuit boards.

Embodiments of the compact drying chamber of the invention enhance a rate of evaporation of water from printed circuit boards and electronic connectors and components by impacting printed circuit boards with heated air at a high velocity to raise the temperature of boards and connectors and components as quickly as possible to rapidly increase a rate of evaporation and completely dry boards within a relatively short drying time. High velocity heated air also increases the temperature of air within the drying chamber, which also enhances a rate of evaporation.

The compact drying chamber of the invention comprises features that substantially reduce the power consumption of the drying chamber to heat and circulate a sufficient volume of high velocity heated air for effective drying. Specifically, the compact drying chamber comprises an insulated housing that provides a well-insulated drying interior that prevents heat loss during drying operations, thereby requiring less power consumption to heat air. The compact drying chamber also comprises a recirculation system to recirculate the heated air that is enclosed within the insulated housing. The recirculation system includes at least one blower and at least one heater and up to two blowers and four heaters in one embodiment of the invention. Enclosing the air blower within the well-insulated atmosphere of the drying chamber minimizes heat loss and, consequently, keeps power consumption to heat air low. In addition, integrating the air blower within the insulated housing eliminates airflow restrictions that translate into an efficient use of blower power for circulating a sufficient volume of high velocity heated air through the drying chamber.

The drying chamber of the invention comprises overall dimensions that allow a compact design. Integrating the recirculation system and particularly the air blower within the drying chamber keeps the overall size of the drying chamber relatively reduced in comparison with sizes of prior art convection dryers and drying systems. In addition, air jet slots used to produce high velocity air streams or air curtains are integrated into one or more air distribution ducts of the drying chamber, which further provides for a compact design.

The overall dimensions of the compact drying chamber of the invention result in a shortened length of the drying chamber and, hence, a shorter conveyance path through which printed circuit boards are conveyed during drying. Thus, the dwell time of printed circuit boards or exposure of printed circuit boards to high velocity heated air is maximized within practical limits by the compact drying chamber.

The compact drying chamber of the invention also maximizes a velocity pressure at which printed circuit boards are impacted by heated air streams to rapidly increase the temperature of the printed circuit boards and electronic connectors and components and, consequently, to significantly enhance a rate of evaporation therefrom. In particular, the compact drying chamber uses specific air jet configurations that maximize the velocity pressure of air and maximize the efficiency of blower power, thereby keeping power consumption of the drying chamber low.

In addition, the compact design of the drying chamber of the invention allows low cost of manufacturing and low cost parts.

BRIEF DESCRIPTION OF THE DRAWINGS

For a better understanding of the present invention, reference is made to the drawings, which are incorporated herein by reference and in which:

FIG. 5 is a cross-sectional side view of the compact drying chamber illustrating an airflow pattern from a plurality of airjet slots.

FIG. 6 is a detail view of an airflow pattern from air jet slots.

FIG. 7 is a detail view of an air jet slot configuration.

DETAILED DESCRIPTION OF THE INVENTION

Figure 1:
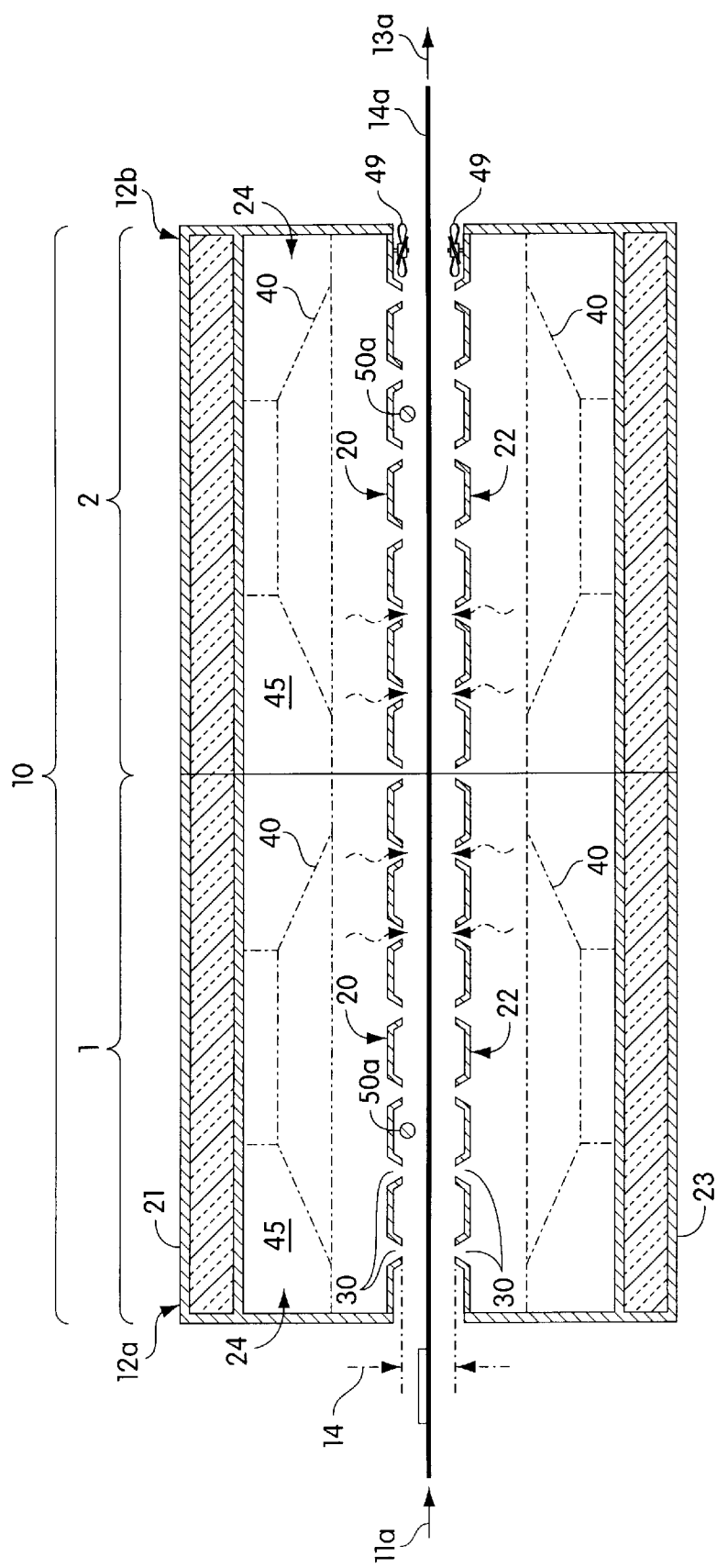
FIG. 1 is a cross-sectional side view of a compact drying chamber according to a first embodiment of the invention comprising two drying zones.

Illustrative embodiments of the invention described below are directed to a drying chamber for drying water-cleansed articles such as printed circuit boards and other electronic assemblies by high velocity heated air. More specifically, embodiments of the invention comprise a compact drying chamber for drying surfaces of printed circuit board and the different types of electronic connectors and components connected or surface-mounted thereto after the bulk of residual water has been physically removed by other dryers or drying processes. The compact drying chamber is designed to remove by an enhanced rate of evaporation small and fine water droplets that remain adhered to surfaces of printed circuit boards due to their high surface tension. The compact drying chamber is also designed to remove by an enhanced rate of evaporation small and fine water droplets that are hidden or embedded within narrow or deep recesses of electronic connectors and components that are difficult if not impossible to physically remove by high velocity heated air streams.

The compact drying chamber of the invention achieves an enhanced rate of evaporation by impacting surfaces of printed circuit boards with high velocity heated air streams to achieve a rapid rate of heat exchange between exposed water droplets and the relatively dry air within the compact drying chamber. The compact drying chamber of the invention also achieves an enhanced rate of evaporation by rapidly increasing the temperature of electronic connectors and components. As the temperature of printed circuit boards is rapidly increased, the temperature of electronic connectors and components also increases rapidly such that small and fine water droplets within such electronic connectors and components become heated, eventually turn into steam and are absorbed by the dry air of the compact drying chamber.

The compact drying chamber of the present invention is capable of removing water from the surfaces of printed circuit boards and the different types of electronic connectors and components by enhancing evaporation through the control of three parameters that affect a rate of evaporation including: (a) the temperature of the heated air, (b) the velocity at which heated air impacts the surfaces of printed circuit boards and (c) the time of exposure or the dwell time of printed circuit boards in high velocity heated air.

The temperature of the convection-heated air provided by the compact drying chamber raises the temperature of printed circuit boards and electronic connectors and components as rapidly as possible by impacting printed circuit boards with high velocity heated air. The higher the temperature of heated air and the greater the velocity at which heated air impinges surfaces of printed circuit boards, the faster a rate of heat exchange and evaporation of water. However, practical limits exist with respect to the temperature to which printed circuit boards may be heated without damaging boards and the electronic connectors and components connected thereto. In particular, a low mass component would increase in temperature more rapidly than the printed circuit board on which it is mounted as well as higher mass components residing on the board. Thus, the practical limit within which the temperature of printed circuit boards and electronic connectors and components may be safely raised must be considered. For a typical low mass electronic component, it was determined that a practical limit to which the temperature of such a component may be safely raised within the compact drying chamber of the invention is up to about 135° C. to avoid damaging printed circuit boards. It was also determined that increasing the temperature of printed circuit boards to over 100° C. results in evaporation of small and fine water droplets from within electronic components and connectors. Thus, the temperature of heated air within the compact drying chamber is controlled within this practical limit.

The compact drying chamber of the invention is constructed and configured to enhance evaporation by maximizing the velocity at which convection-heated air impacts printed circuit boards. The compact drying chamber maximizes the velocity of convection-heated air with an efficient use of power, thereby keeping power consumption of the compact drying chamber low. Specifically, it was determined that the velocity of heated air impacting printed circuit boards within the compact drying chamber is affected by the size and shape of air jet slots supplying air. Embodiments of the compact drying chamber according to the invention comprise specific shapes and sizes of air jet slots designed to provide efficient performance and maximize air velocity. In addition, pressure used to produce high velocity air streams through air jet slots and a clearance distance between air jet slots and printed circuit boards were also determined to affect air velocity within the compact drying chamber.

The compact drying chamber of the invention is also constructed and configured to enhance a rate of evaporation by maximizing the dwell time of printed circuit boards or the time of exposure to high velocity convection-heated air, while maintaining a relatively short product path area that allows reduced overall dimensions of the drying chamber. A length and a speed of conveyance of printed circuit boards through the compact drying chamber of the invention affect the dwell time of printed circuit boards. It was determined and selected that the maximum desired length of conveyance of the compact drying chamber is less than 2000 mm (7 feet), and the desired speed of conveyance about 1500 mm per minute.

Embodiments of the invention will be described below in further detail with reference to FIGS. 1–9, which are presented for illustrating embodiments and are not intended to limit the scope of the claims.

Referring to FIG. 1, a first embodiment of the invention provides a compact drying chamber comprising at least two distinct drying zones 1 and 2, similar in structure and configuration as well as operation, joined to produce a single compact drying chamber 10. Each drying zone 1 and 2 of the compact drying chamber 10 comprises an insulated housing 12a and 12b to provide a well-insulated drying interior and to prevent heat loss; a relatively short product path area 14 through which the printed circuit boards are conveyed for drying; at least an upper gas distribution duct 24 above (as shown) or below the product path area to pressurize and supply a sufficient volume of heated air to the product path area; a plurality of air jet slots 30 integrated in the upper gas distribution duct to eliminate use of air nozzles or air knives and allow a compact size, each air jet slot 30 being configured to produce uniform heated airjets or heated air curtains and to maximize a velocity at which heated air is delivered to the product path area; and a gas recirculation system including a first blower 44 (shown in phantom) and at least a first heating device 50 (shown in phantom) disposed within the insulated housing to provide an efficient use of blower power, minimize heat loss and allow a reduced overall size of the drying chamber.

Figure 2:
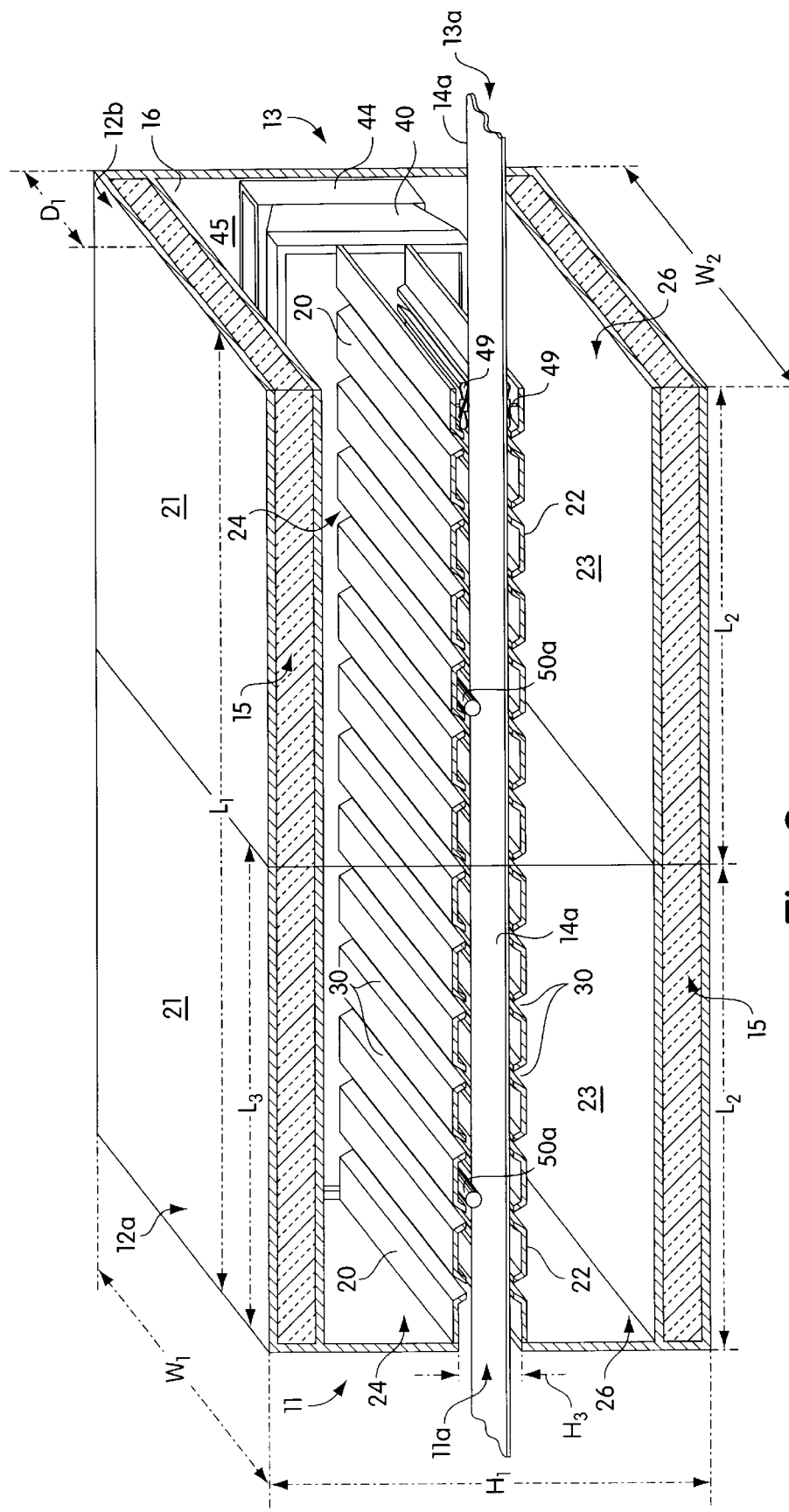
FIG. 2 is a perspective view of the two drying zones.
Figure 3:
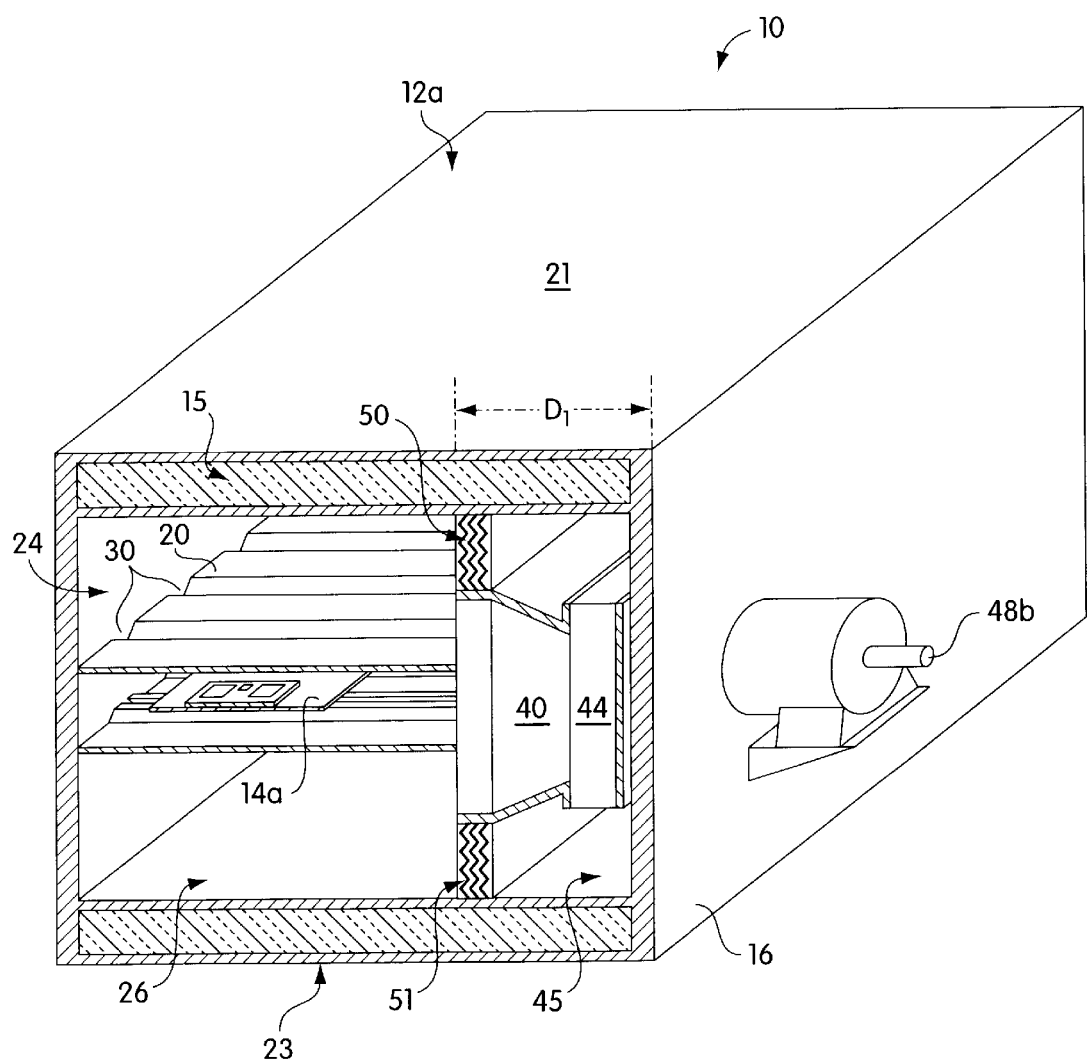
FIG. 3 is a perspective side view of one of the two drying zones.
Figure 4:
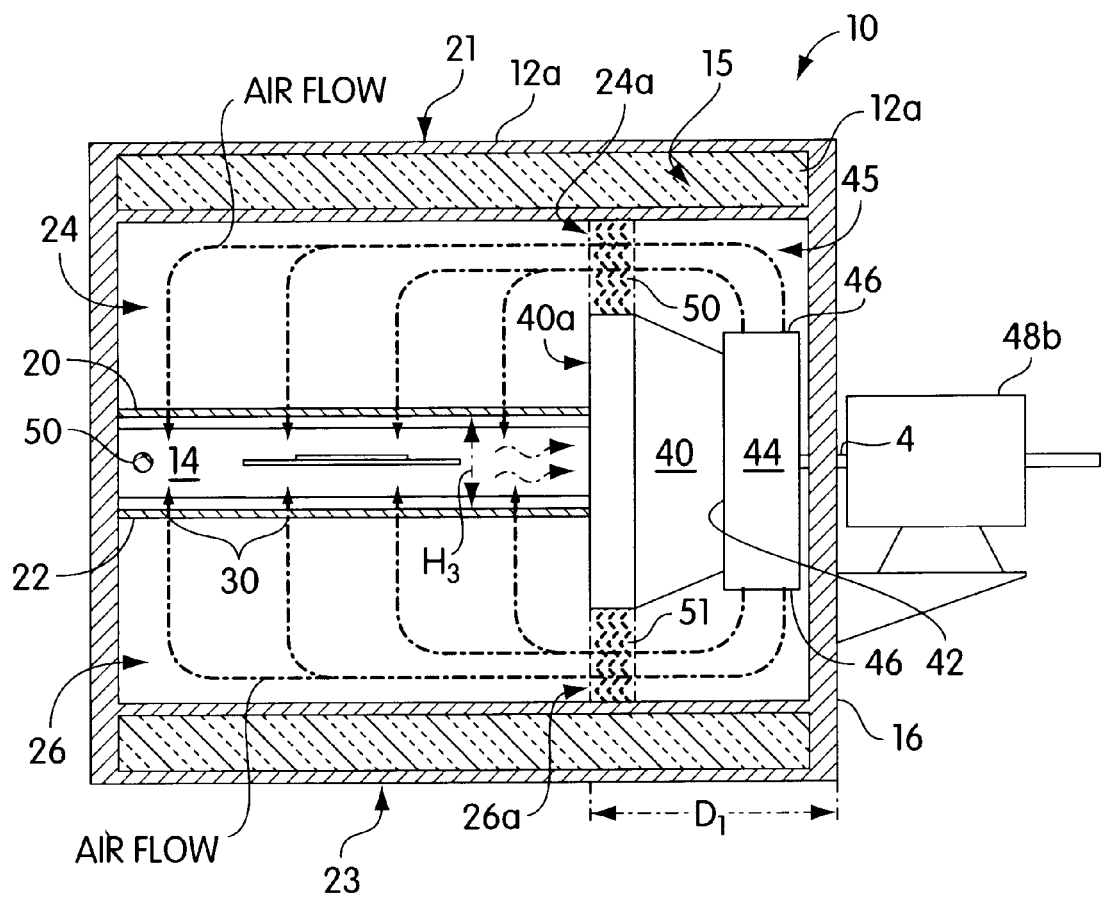
FIG. 4 is a cross-sectional end view of one of the drying zones illustrating an airflow pattern within the drying zone.

Referring to FIGS. 2–4, the first embodiment of the compact drying chamber according to the invention is illustrated in further detail. As shown in FIG. 2, the compact drying chamber comprises the two drying zones 1 and 2 each enclosed within the insulated housing 12a and 12b to produce the single compact drying chamber having a length $L_1$, a width $W_1$ and a height $H_1$ wherein the length $L_1$ extends between a first end 11 and a second end 13 to define a substantially enclosed structure. The length $L_1$ of the compact drying chamber is from about 1000 mm to about 2000 mm, and preferably about 1500 mm; the width $W_1$ is from about 900 mm to about 1200 mm, and preferably about 1000 mm; and the height $H_1$ is from about 350 mm to about 750 mm, and preferably about 500 mm. The length $L_2$ of each drying zone 1 and 2 is from about 500 mm to about 1000 mm, and the width $W_2$ of each drying zone from about 900 mm to about 1200 mm.

The overall dimensions of the drying chamber allow a compact design and a substantially reduced footprint relative to prior art convection dryers and drying systems. In particular, a desired length of the drying chamber of the invention is about 1500 mm, which is substantially shorter than some prior art dryers that seek to enhance evaporation by maximizing dwell time of printed circuit boards through use of a large number of air nozzles or air knives and a drying chamber having a length of about 3660 mm (~12 feet). The relatively short length of the compact drying chamber consequently allows a short path of conveyance of printed circuit boards through each of the drying zones 1 and 2.

The compact size of the drying chamber allows the drying chamber of the invention to be used independently as a single means for completely drying printed circuit boards by enhanced evaporation. In addition, the compact size allows the drying chamber of the invention to be integrated with other dryers or drying systems such as air knife dryers and air nozzle dryers to provide supplemental drying or an additional drying phase to insure printed circuit boards are completely dry, particularly densely populated boards or high mass electronic components that require longer dwell times. The overall dimensions of each of the drying zones 1 and 2 allows the compact drying chamber of the invention to include additional drying zones to lengthen the path of conveyance and, hence, to increase the dwell time within the compact drying chamber as is required.

The housing 12a and 12b of the compact drying chamber is constructed of a suitable material such as, although not limited to, aluminum, stainless steel, painted steel and aluminized steel. The housing also includes a layer of insulation 15 disposed on exterior surfaces of the housing to prevent heat loss from the drying chamber and to help facilitate an efficiency with respect to power consumed for heating and circulating pressurized air within the drying chamber. The insulation is a suitable insulation well known in the art such as, although not limited to, fiberglass. The insulated housing provides a well-insulated interior in which the gas recirculation system is disposed to help minimize heat loss and to keep power consumption low. The materials of construction of the housing and the insulation are preferred due to their performance, low cost and reliability.

The drying chamber further comprises a product path area 14 within the insulated housing 12a and 12b that extends substantially horizontally from a product inlet 11a disposed at the first end 11 of the drying chamber to a product exit 13a disposed at the second end 13 of the insulated housing. Printed circuit boards are conveyed for drying through the product path area from the product inlet to the product exit. The product inlet has approximate dimensions of about 120 mm by about 610 mm, and the product exit has approximate dimensions of about 120 mm by about 610 mm. The dimensions of the product inlet and the product outlet are preferred to prevent heat loss and to provide a minimum clearance that will printed circuit boards to clear the product inlet and the product outlet as they are being carried through the drying chamber.

The product path area 14 of each drying zone 1 and 2 is bounded or defined by a first discharge plate 20 disposed within the insulated housing 12a and 12b substantially parallel to the product path area 14. The first discharge plate 20 comprises a plurality of sheets of suitable material such as, although not limited to, stainless steel that are assembled and joined in series to form a single plane or plate. In one embodiment, two substantially similar sheets are joined such that an edge of one of the two sheets opposes in facing relation an edge of the other sheet in a substantially same plane to define a slot or an elongated aperture. A plurality of sheets of stainless steel are similarly assembled and joined to one another in series in a similar manner in which opposing edges of two sheets are in facing relation to one another in a substantially same plane to define a plurality of slots or elongated apertures 30. The first discharge plate 20 of the drying chamber essentially comprises the plurality of stainless steel sheets assembled and joined in series to form the single plate and to define the plurality of slot or elongated apertures 30.

The first discharge plate has a length extending along at least a portion of an internal length $L_3$ of the insulated housing and a width extending across at least a portion of an internal width $W_3$ of the insulated housing 12a and 12b of each of the drying zones 1 and 2. The internal length $L_3$ of the insulated housing 12a and 12b of each of the two drying zones 1 and 2 is from about 60 mm to about 100 mm less than $L_1$, and about 60 to about 100 mm less than $W_1$, and preferably about 80 mm less.

In one embodiment, the first discharge plate 20 extends substantially the internal length $L_3$ of the insulated housing 12a and 12b and extends substantially the internal width $W_3$ of the housing to define an upper gas distribution duct 24 between an upper portion 21 of the insulated housing 12a and 12b and the first discharge plate 20. As will be described herein in further detail, a gas blower 44 such as an air blower pressurizes the upper gas distribution duct 24 forcing air from the upper gas distribution duct 24 through the plurality of slots 30 of the first discharge plate 20 to the product path area 14. The air blower 44 blows air at a sufficient pressure and at sufficient volume that it essentially forces air through the first gas distribution duct 24 and the plurality of air jet slots 30 to the product path area 14.

In one embodiment, the insulated housing 12a and 12b further comprises a second discharge plate 22 similar to the first discharge plate 20 that is positioned below and substantially parallel to the product path area such that the first discharge plate 20 and the second discharge plate 22 define the product path area 14 in each of the two drying zones 1 and 2. In one embodiment, the second discharge plate 22 is similarly constructed and configured as the first discharge plate comprising a plurality of stainless steel sheets assembled and joined in a series such that a plurality of slots 30 or elongated apertures are defined. The second discharge plate 22 has a length extending along at least a portion of the internal length $L_3$ of the insulated housing and a width transversing at least a portion of the internal width $W_3$ of the insulated housing. In one embodiment, the second discharge plate extends substantially the internal length $L_2$ of the insulated housing and extends substantially across the internal width $W_3$ of the housing to define a lower gas distribution duct 26 between a lower portion 23 of the insulated housing and the second discharge plate 22. The lower gas distribution duct 26 is similar in configuration and function to the upper gas distribution duct 24, conducting pressurized heated air from the gas blower 44 through the plurality of slots 30 integrated therein to the product path area 14.

Each drying zone 1 and 2 of the compact drying chamber 10 of the first embodiment comprises the first discharge plate 20 and the second discharge plate 22 positioned substantially parallel to the product path area 14 to define the upper gas distribution duct 24 and the lower gas lower gas distribution duct 26, respectively. In one embodiment, the product path area includes a continuous conveyor 14a disposed substantially horizontal to the upper and lower gas distribution duct in the product path area. The continuous conveyor is any suitable type of conveyor known in the art having a substantially planar surface on which printed circuit boards are placed for conveyance through the product path area for drying.

Referring to FIGS. 1–4, each drying zone 1 and 2 further comprises a gas recirculation system enclosed within the insulated housing 12a and 12b to circulate pressurized heated air to the product path area 14. The gas recirculation system of each drying zone comprises an air intake 40 positioned within the insulated housing 12a and 12b adjacent to the product path area 14, the air intake being connected to the gas blower 44. The blower is located within the insulated housing preferably between the air intake 40 and a side wall 16 of the insulated housing. In addition, each of the first and the second distribution ducts 24 and 26 includes a heating device 50 and 51 to heat air by convection.

The compact drying chamber provides the benefit of significantly reduced power consumption by recirculating convection-heated air through the drying chamber, thereby minimizing power requirements to heat air and to circulate air at a sufficient pressure and velocity to enhance evaporation. Prior art dryers and drying systems typically do not recirculate air for convection heating, as does the compact drying chamber of the invention. Prior art dryers and drying systems typically use one or more large external air blowers for air circulation that are prevented, due to their size, from being incorporated within a dryer housing. Consequently, prior art designs have relatively high power requirements to supply air to the dryer and to heat and circulate air for drying. Integrating the air intake and the air blower of the gas recirculation system of the invention within the well-insulated interior of the compact drying chamber minimizes heat loss and keeps power required to heat air very low. In addition, integrating the air blower within the insulated housing eliminates airflow restrictions, thereby allowing an efficient use of blower power to recirculate air. Also, with recirculation of heated air, the exhaust requirements of the compact drying chamber are kept to a minimum. Prior art dryers typically require about 1500 to about 3000 scfm of exhaust, whereas the drying chamber of the invention requires about 10 scfm.

Although the gas recirculation system as described herein recirculates air for drying printed circuit boards, other gases may be used to dry printed circuit boards and electronic connectors and components, or may be used for other process applications. For instance, the drying chamber of the invention can be modified to use nitrogen to dry different types of articles that are susceptible to oxidation.

As shown in FIGS. 2–4, the air intake 40 is positioned adjacent to the product path area 14 to draw air from the product path area for recirculation. The air intake 40 is typically as wide as the internal length $L_3$ of the insulated housing 12*a* and 12*b* and as high as the height $H_3$ of the product path area. The air intake is parallel to the side wall 16 of the insulated housing 12*a* and 12*b* and positioned between the side wall 16 and the product path area such that one side of the product path area is bounded by the air intake. The air intake 40 and the blower 44 occupy a blower chamber 45 defined by the air intake 40 and the side wall 16 of the housing 12 with a relatively compact depth $D_1$ of about 350 mm.

As shown in FIG. 4, the air intake 40 has a shallow depth and is concave cone shape gradually curving inward from an opening 40*a* of the air intake facing the product path area 14 to form a gas outlet 42. As shown in FIG. 4, the opening 40*a* of the air intake 40 has a height of about 6 inches and the air intake 40 extends therefrom toward the blower 44 by initially expanding to a larger width of about 10 inches and then gradually curving inward to the gas output 42. The gas output 42 is connected to the blower 44. Air is drawn from the product path area 14 along the internal length $L_3$ of the drying chamber into the opening 40*a* and through the air intake 40 in a direction opposite and parallel to the direction of conveyance, which results in a rapid return of air to the blower 44. Each drying zone 1 and 2 contains about 10 cubic feet of air and the blower 40 moves about 2000 cfm such that air is circulated about 200 times per minute.

The air blower 44 comprises an intake temperature of up to 150° C. that does not require cool air to be added, thereby significantly reducing the exhaust requirements of the drying chamber. The power of the air blower is limited by a size that can be accommodated by the compact depth $D_1$ that the air blower occupies in the drying chamber. The air blower has a power of about 2 hp to about 5 hp, and preferably about 3 hp.

The blower 44 comprises a backward inclined impeller that receives the gas output 42. The blower is connected to a drive shaft 48*a* of a motor 48*b* located external to each of the drying zones, which rotates the drive shaft to operate the blower. In one embodiment, the blower may include other similar types of blowers well known in the art for use in blowing air through a gas distribution duct, a distribution duct or other similar ventilating means. Thus, the drying chamber of the invention provides significantly reduced power consumption by recirculating air and incorporating the gas recirculation system within the insulated housing. As will be described herein, the drying chamber provides efficient use of blower power by integrating air jet slots in the gas distribution ducts to keep power consumption low.

As shown in FIGS. 1–4, a first heating device 50 occupies an opening or inlet 24*a* of the upper gas distribution duct 24 and a second heating device 51 occupies an opening or inlet 26*a* of the lower gas distribution duct 26. The first and second heater devices 50 and 51 are positioned proximate to the blower impeller 44. The blower impeller 44 pushes air from its circumference 46 thereby pressurizing the blower chamber 45. Pressurized air exits the blower chamber 45 to the first and the second distribution ducts 24 and 26 through the openings 24*a* and 26*a* occupied by the first heater 50 and the second heater 51. Each of the heating devices 50 and 51 may include a suitable heating device well known in the art such as, although not limited to, an electric heating element. The heating device includes the capability of presetting to a desired temperature. The drying chamber comprises a maximum temperature setting of 150° C. As noted, the practical limit within which printed circuit boards may be heated to enhance evaporation within the drying chamber is up to about 135° C. In particular, it is desirable that printed circuit boards exit the compact drying module at a temperature no greater than 60° C. The temperature of the printed circuits boards is lowered by means of one or more cooling fans 49 disposed proximate to the product exit 13*a* of the insulated housing 12.

Each of the drying zones 1 and 2 further comprise one or more temperature sensing devices 50 disposed in the product path area 14 such as a thermocouple or temperature sensor for assessing the temperature of convection-heated air produced into the product path area. The temperature sensing device may send an output signal to a display device to indicate the temperature of the product path area. In addition, the temperature sensing device may send a signal to a temperature controller that turns the heaters 50 and 51 on and off to maintain the desired temperature.

Each drying zone 1 and 2 of the compact drying chamber includes the recirculation system, the heating devices and the temperature sensing device to achieve independent convection-heating. The parameters for convection-heating and drying printed circuit boards in each drying zone in effect can be different. Separation of the compact drying chamber into the two drying zones with independent air recirculation and air temperature control provides the benefit of flexibility and a finer temperature control of convection-heated air streams produced to dry printed circuit boards. Each drying zone can provide high velocity heated air at a pressure and temperature for different drying requirements, depending upon the types of printed circuit boards or electronic assemblies to be dried. For instance, printed circuit boards that are densely populated with high mass electronic components may be exposed to high temperature air streams at a maximum pressure in drying zone 1 for a relatively short dwell time to rapidly increase the temperature of boards and components. Thereafter, such boards and high mass components may be subsequently exposed to lower temperature air streams in drying zone 2 for a relatively longer dwell time to sustain the boards and components at the desired temperature.

Referring to FIG. 4, an airflow pattern of the compact drying chamber during operation is illustrated. The blower 44 draws air through the air intake 40 in a direction substantially perpendicular to the direction of conveyance of printed circuit boards to remove air from the product path area 14. The blower simultaneously blows air from its impeller circumference 46 at a sufficient pressure to recirculate air to the upper and the lower gas distribution ducts 24 and 26. Air is forced through the first and second heating devices 50 and 51 into the upper and the lower gas distribution ducts to transfer heat to recirculating air to raise the temperature of air to a desired preset temperature. Pressurized heated air accumulates in the upper and the lower gas distribution ducts 24 and 26 and then forced through the plurality of air jet slots 30 to the product path area 14.

The drawing action produced by the blower 44 as it pulls air from the length of the product path area through the air intake 40 is significant. The drawing action is produced by the discharge or blowing of air from the blower impeller circumference 46 to recirculate air to the upper and lower gas distribution ducts 24 and 26. Air is thereby continuously recirculated, which keeps power consumption and exhaust requirements low.

Air is exhausted from the drying chamber at the product inlet 11a. This exhaust creates a drawing effect at the product exit 13a that draws dry air external to the drying chamber to the product exit 13a and into the drying chamber. New air is drawn from the product exit 13a at a rate of about 10 cfm, which is sufficient to remove water from the conveyor loaded with printed circuit boards.

As noted, the velocity at which heated air impinges surfaces of printed circuit boards is maximized to achieve rapid surface evaporation and to raise the temperature of printed circuit boards and electronic connectors and components as quickly as possible to enhance evaporation from connectors and components. The velocity at which heated air is supplied to printed circuit boards must be maximized within the relatively confined and short product path area of the compact drying chamber. The velocity of heated air produced from the upper and the lower gas distribution duct 24 and 26 is affected by four factors including 1.) the size of air jet slots; 2.) the shape of air jet slots; 3.) the distance or clearance between surfaces of printed circuit boards and openings of air jet slots; and 4.) the pressure to produce air to the product path area.

Referring to FIGS. 1–5, each of the first and second discharge plates 20 and 22 includes the plurality of air jet slots 30. Each airjet slot 30 is essentially formed in the plane of material with which the discharge plate is constructed and is integral a surface of the discharge plate in facing relation to the product path area 14. Integration of the plurality of air jet slots 30 with the first and the second discharge plates 20 and 22 provides the benefit of maximizing the blower power and serves as a power efficient means for producing high velocity convection-heating air streams to the product path area, as described herein in further detail. In addition, integration of the plurality of air jet slots with the first and the second discharge plates provides the benefit of eliminating a large number of discrete air nozzles and air knives as well as individual air supply lines typically used by prior art dryers. Without a need to accommodate a large number of air nozzles, knives and supply lines, the drying chamber has significantly reduced overall dimensions. Integration of the plurality of airjet slots with the discharge plates also removes airflow restrictions between the air blower and air jet slots, thereby allowing unobstructed airflow and an efficient use of blower power.

The plurality of air jet slots 30 is distributed along a length of each of the first and the second discharge plates 20 and 22 to supply high velocity heated air to various points along the product path area 14. Each air jet slot 30 transverses at least a portion of a width of each discharge plate to supply heated air to at least a portion of a width of the product path area. In one embodiment, each air jet slot has a substantially elongate shape transversing the width of the discharge plate in a substantially perpendicular orientation to the product path area. During operation of the compact drying chamber, high velocity heated air is forced through each air jet slot. As heated air passes through an air jet slot, the elongate configuration produces a substantially uniform heated air jet or heated air curtain that transverses the width of the product path area perpendicular to the direction of conveyance of printed circuit boards through the product path area. As printed circuit boards are conveyed through the drying chamber, surfaces of printed circuit boards are repeatedly impinged by a plurality of high velocity heated air jets or heated air curtains. Each heated air jet or heated air curtain impinges and bathes substantially an entire surface of each printed circuit board. The high velocity at which heated air impinges printed circuit boards allows a significant volume of heated air to impact surfaces of printed circuit boards, thereby raising the temperature of printed circuit boards rapidly within the relatively short length of conveyance through the product path area.

Referring to FIGS. 5–6, in one embodiment each air jet slot 30 of the first discharge plate 20 is opposite to and in substantial vertical alignment with each air jet slot of the second discharge plate 22. As a printed circuit board is conveyed between the first and the second discharge plates, a point on a top surface of the printed circuit board and a corresponding point in vertical alignment on a bottom surface of the printed circuit board are simultaneously impinged by heated air jets or heated air curtains. Such an arrangement of airjet slots helps to rapidly increase the temperature of printed circuit boards and electronic connectors and components.

Figure 8:
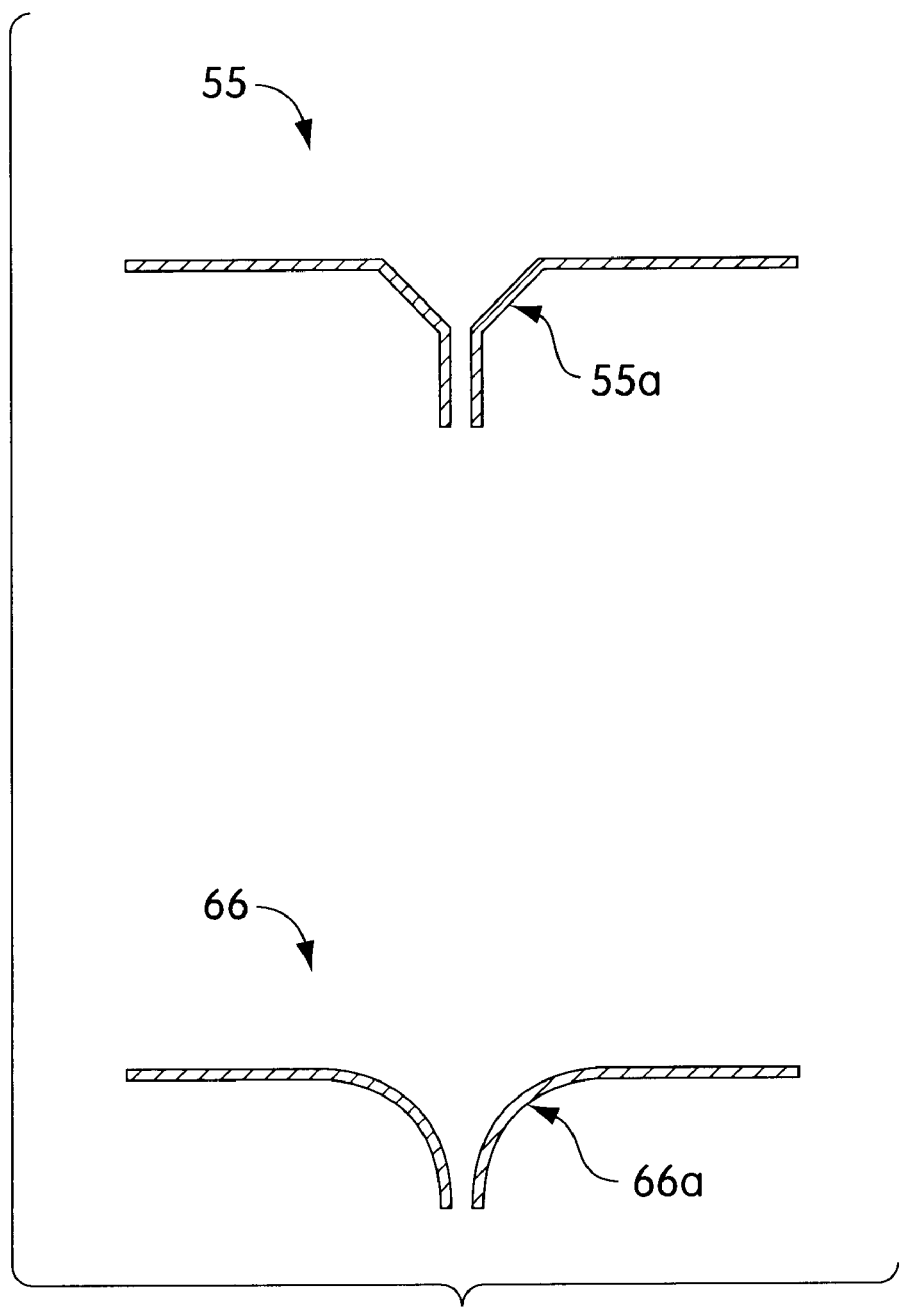
FIG. 8 is cross-sectional views of air jet slot configurations.

Referring to FIGS. 5–8, factors noted that effect the velocity of heated air include the size and the shape of air jet slots. As described above, in one embodiment each air jet slot 30 comprises an elongate shape or configuration that produces a substantially uniform air jet or air curtain as pressurized air is blown at high velocity from the air blower through the upper and lower gas distribution ducts 24 and 26 and each air jet slot. As shown in FIG. 8, cross-sectional views of two different configurations of air jet slots are depicted that were tested to determine the effects of the shape and the size of each air jet slot configuration on the velocity at which heated air impacts printed circuit boards.

The two air jet slot configurations shown in FIG. 8 were tested to compare the air jet slot configurations 55 and 66 with different air jet slot configurations to determine the effects of the shape and the size of each air jet slot configuration at various pressures at a given blower power. Determining pressure of air produced from the different air jet slot configurations indicates which configurations provide the most efficient use of blower power or have the greatest delivery power. As the air blower 44 used in each drying zone 1 and 2 occupies a relatively shallow depth $D_1$ within the blower chamber 45, the blower cannot be large in size. In addition, the velocity at which the air is drawn by the air intake 40 into the blower without drawing printed circuit boards toward the air intake or blowing printed circuit boards from the conveyor 14a also limits the blower power. Therefore, to provide for a compact design of the drying chamber, the blower output must be used efficiently to maximize air pressure and, hence, a velocity at which air impacts printed circuit boards. Compressed air was used through a regulator in the testing to assess the effects of the shape and the size of air jet slots. Air pressure and the width of a slot opening were varied for each configuration. Three different pressures including 2.7 in/wc, 5.6 in/wc and 8.6 in/wc and two different slot sizes were tested. The width was adjusted to produce a similar airflow rate for each shape.

Figure 9:
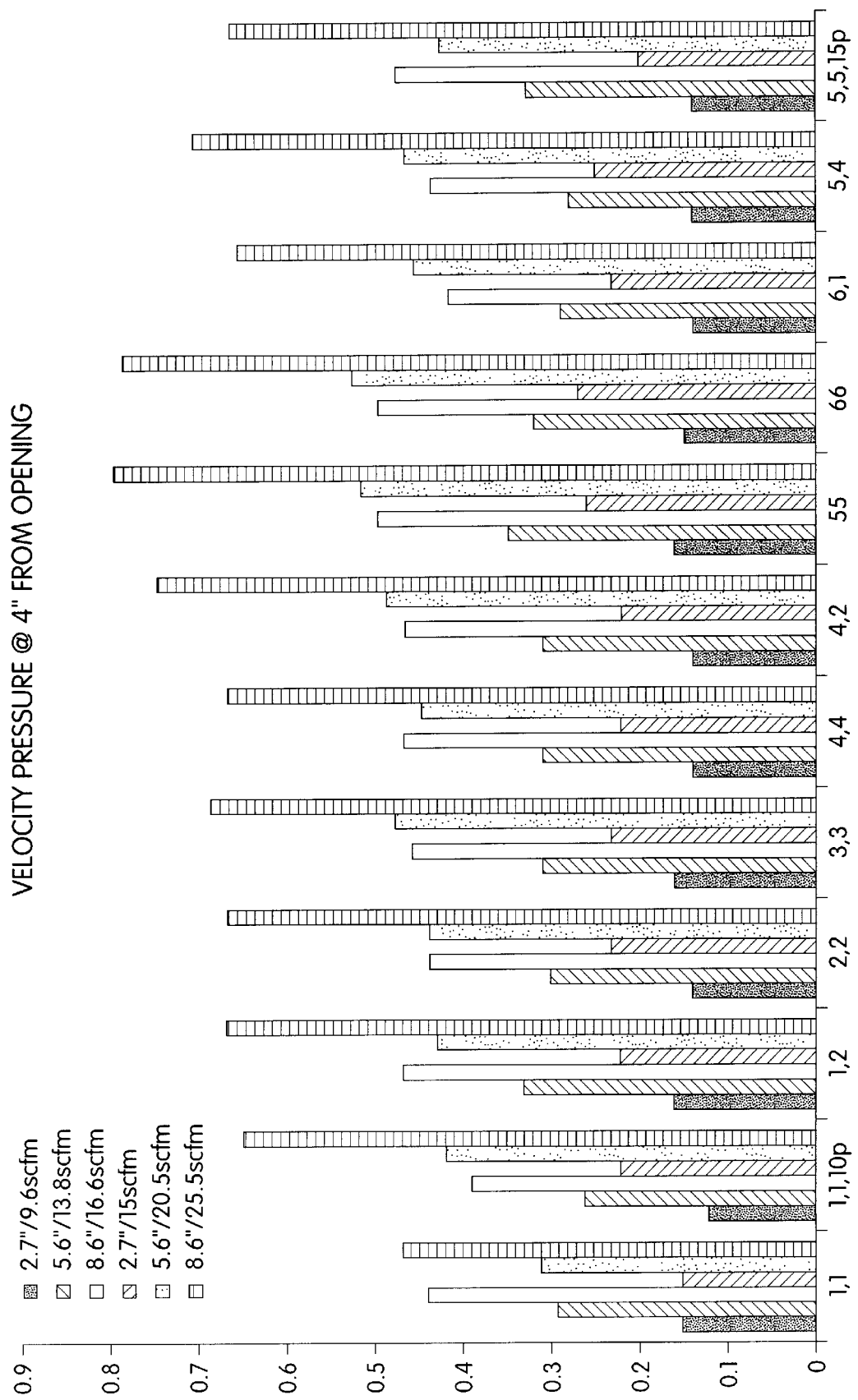
FIG. 9 is a graph reporting results of a comparison test of different air jet slot configurations.

Referring to the graph in FIG. 9, the relative velocity pressure of air produced by the different slot widths and pressures was measured at a desired minimum clearance of 100 mm. The minimum clearance between an opening of an air jet slot and printed circuit board was previously determined to be about 100 mm for the compact drying chamber of the invention. The tests sought to determine the delivery power afforded by each air jet slot configuration at the desired minimum clearance.

As shown in FIG. 9, the relative velocity pressures measured at 100 mm demonstrate that the airjet slot configurations designated 55 and 66 provide the most efficient performance. A comparison of the different shapes of air jet slots at the same pressure (in/wc) and flow rate (scfm) indicates the shapes of the 55 and 66 configurations deliver air at higher velocity pressure than other shapes. At a distance of about 100 mm from the airjet slot, the 55 and 66 configurations supply air with the greatest impact at a velocity pressure of about 0.7 in/wc to about 0.9 in/wc. The efficient use of blower power is achieved in the drying chamber of the invention with use of a plurality of airjet slots having the 55 or 66 configurations to maximize the velocity at which air impacts printed circuit boards.

Thus, at about 100 mm from air jet slots integrated in the first discharge plate, the velocity pressure of gas impacting a top surface of the conveyor is about 0.2 in/wc to about 0.4 in/wc. At about 50 mm from air jet slots integrated in the second discharge plate, the velocity pressure of gas impacting a bottom surface of the conveyor is about 0.2 in/wc to about 0.6 in/wc.

The air jet slot configurations 55 and 66 each include a width of from about 2 mm to about 8 mm, and preferably about 4 mm. The air jet slot configuration 66 is defined by two substantially parallel and opposing extensions 66a that extend downward from the first discharge plate or upward from the second discharge plate. As shown in FIG. 8, the slot configuration 66 includes a symmetrical cross-section about a center vertical axis including two smooth curved extensions such that the air jet slot configuration 66 has a substantially concave V-shaped cross-section. The air jet slot configuration 55 is similarly defined by two substantially parallel and opposing extensions 55a that extend downward from the first discharge plate or upward from the second discharge plate. As shown in FIG. 8, the slot configuration 55 includes a symmetrical cross-section about a center vertical axis including two smooth straight extensions 55a such that the air jet slot configuration 55 has a substantially Y-shaped cross-section.

As shown in FIGS. 6–7, the plurality of air jet slots of the drying chamber of the first embodiment comprises air jet slots having the configuration 66 with the smooth curved concave V-shaped extensions 66a. When air passes through the airjet slot 66, air passes through the smooth curved extensions 66a and draws along air surrounding the slot by friction or entrains air. The smooth curved extensions 66a provide minimum resistance to the airflow and thereby reduce the turbulence of the airflow produced to the product path area. The air jet slot configuration 55 produces the same entraining effect with the smooth straight extensions 55a of the Y-shaped cross-section.

As noted, another factor effecting the velocity at which heated air is supplied to the product path area is a distance or clearance between surfaces of printed circuit boards and openings of air jet slots. As shown in FIGS. 4–5, the product path area 14 includes a height $H_3$ from about 100 mm to about 200 mm, and preferably about 150 mm. The preferred minimum clearance between the first discharge plate 20 and the top surfaces of printed circuit boards disposed upon the continuous conveyor 14a is about 100 mm, although such clearance may be from about 25 mm to about 150 mm. In addition, a preferred minimum clearance between the second discharge plate and bottom surfaces of printed circuit boards is about 50 mm, and may range from about 20 mm to about 100 mm.

As discussed herein with respect to FIG. 9, another factor affecting the velocity at which heated air is supplied to the product path area includes pressure of air to produce impinging air streams or air curtains. Such pressure is limited in the drying chamber of the present invention by the materials used to construct the drying chamber. To provide material strength and low manufacturing costs, the first and second discharge plates are preferably constructed of 16 ga. stainless steel, which can withstand pressure of preferably about 750 Pa (3 in/wc). It is understood that a more rigid construction of the drying chamber would allow performance at higher pressures. The preferred materials were chosen due to their relatively low manufacturing costs and to significantly reduce the extent of fatigue due to distortion and expansion for instance of the side walls of the housing, thereby increasing the performance life of the drying chamber.

Thus, the velocity of heated air impacting printed circuit boards is efficiently maximized within the compact drying chamber of the invention by blowing air at pressure of about 750 Pa. through a plurality of air jet slots having the preferred configurations of 55 or 66 to surfaces of printed circuit boards conveyed at about 100 mm from the air jets slots.

In addition to the velocity at which heated air impinges printed circuit boards, as described above, the dwell time or the length of exposure of each point on surfaces of printed circuit boards is also considered in the design of the compact drying chamber to enhance evaporation. The overall dimensions of the drying chamber of the invention allow a relatively short path of conveyance. Therefore, to maximize the dwell time of printed circuit boards requires a sufficient volume of heated air (a sufficient number of air jet slots) that would maximize the dwell time within the practical limits of the structure and configuration of the compact drying chamber. Volume at which air is recirculated through the air blower affects the velocity at which the air is delivered to the product path area and, hence, the velocity at which air impacts surfaces of printed circuit boards. As air volume increases, the velocity of air produced to the product path area increases.

However, there is a practical limit to the volume of air that can be circulated through the product path area given the overall dimensions, as described herein. The clearance $H_3$ between the upper and the lower gas distribution ducts of the product path area is limiting in that there is a limited volume of air which can be withdrawn from the product path area by the air intake without drawing printed circuit boards toward the air intake during operation of the drying chamber. In addition, a maximum air velocity that printed circuit boards can withstand without being blown from the conveyor limits the volume of air. Thus, a maximum velocity at which convection-heated air may be delivered to the product path area is slightly less than a point at which printed circuit boards are drawn toward the air intake or blown from the conveyor.

With the minimum clearance requirement of about 100 mm, the maximum velocity at which pressurized air can be produced to the product path area is from about 1000 cfm to about 2500 cfm, and preferably 2000 cfm per drying zone 1 and 2 for lightweight printed circuit boards wherein "lightweight" refers to a printed circuit board having a weight of about 50 grams to about 200 grams. Therefore, for printed circuit boards of greater weight, air volume and velocity may be increased.

At the preferred air volume of 2000 cfm per drying zone 1 and 2, the number of air jet slots is limited to about 7 to 8 per drying zone, and about 15 for the entire length of the product path area within the compact drying chamber. Thus, with 15 air jet slots producing air streams or air curtains at about 2000 cfm per drying zone 1 and 2, the compact drying chamber provides sufficient dwell time of printed circuit boards in high velocity heated air as they are conveyed along the preferred conveyance length of about 1500 mm at the preferred minimum conveyance speed of about 1500 mm/min to significantly enhance a rate of evaporation of water and achieve completely dry printed circuit boards within a relatively short drying time.

Thus, as described herein, embodiments of the compact drying chamber according to the invention enhance the velocity of heated air impacting surfaces of printed circuit boards, the dwell time of the printed circuit boards within a short conveyance path, and the rapid rate at which the temperature of printed circuit boards and electronic connectors and components is raised during drying while providing the benefits of substantially reduced power consumption and compact dryer dimensions. Embodiments of the compact drying chamber according to the invention also provide the benefits of recirculating air, minimizing heat loss, reducing airflow restrictions, and reducing manufacturing and operating costs.

In one embodiment, the drying chamber of the invention is disposed within a primary dryer for drying printed circuit boards and other electronic assemblies wherein the drying chamber comprises an insulated housing and at least two drying zones disposed within the insulated housing to dry printed circuit boards and other electronic assemblies by convection heating, as described herein. In this embodiment, the drying chamber of the invention serves as an additional or supplemental dryer to the primary dryer, which removes the bulk of residual water on surfaces of printed circuit boards by physically removing such water by jets of air provided by air delivery mechanisms such as air knives and air nozzles. The compact design and reduced overall dimensions of the drying chamber of the invention permits the drying chamber to be disposed within the primary dryer or drying system.

In another embodiment of the drying chamber of the invention, a dryer or drying system used for drying printed circuit boards and other electronic assemblies comprises at least one drying chamber according to the invention. In this embodiment the dryer or drying system comprises one or more drying chambers of the invention that each include two drying zones, as herein described, to serve as the primary dryer or drying system. Thus, the compact drying chamber of the invention provides flexibility with respect to its application to various drying configurations and dryer designs.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A chamber for drying printed circuit boards and other electronic assemblies by convection heating comprising:

a housing defined by an upper wall portion and a lower wall portion, each wall portion having a length and a width, and a first side wall and a second side wall, each side wall connecting the upper wall portion to the lower wall portion; and at least a first drying zone disposed in the housing, the first drying zone including:

(i) a first gas distribution duct defined by the upper wall portion and a first discharge plate, the first discharge plate spaced from and below the upper wall portion and having a length extending along at least a portion of the length of the upper wall portion and a width extending along at least a portion of the width of the upper wall portion, (ii) a conveyor spaced from and below the first discharge plate, the conveyor extending at an orientation substantially parallel to the first discharge plate from an inlet at a first end of the housing to an exit at a second end of the housing to convey the printed circuit boards and other electronic assemblies through the first drying zone and to define a product path area between the first discharge plate and the conveyor, (iii) a plurality of slots defined in the first discharge plate and configured to allow gas within the first distribution duct to vent from the first gas distribution duct, each slot being defined in the first discharge plate in an orientation substantially perpendicular to the direction in which the conveyor conveys the printed circuit boards and other electronic assemblies;

(iv) a gas intake disposed in a side chamber, the gas intake being adjacent and facing the conveyor and extending along at least a portion of the first drying zone, the side chamber being defined between the first side wall of the housing and the gas intake and extending along an interior length of the housing, the side chamber being in fluid communication with the first gas distribution duct via a first gas inlet, the gas intake being further disposed and configured to receive gas drawn from the product path area and to vent gas to a gas blower disposed in the side chamber and operatively coupled to the gas intake, the gas blower being further disposed and configured to draw gas from the product path area through the gas intake and to blow at least a portion of drawn-in gas into the side chamber and through the first gas inlet into the first gas distribution duct and through the plurality of slots to the product path area.

2. The chamber of claim 1 wherein each slot includes a width of from about 2 mm to about 8 mm, and preferably about 4 mm.

3. The chamber of claim 2 wherein each slot includes a substantially concave V-shaped cross-section.

4. The chamber of claim 2 wherein each slot includes a substantially Y-shaped cross-section.

5. The chamber of claim 1 wherein each slot allows gas to impact a top surface of the conveyor at a velocity pressure of from about 0.2 in/wc to about 0.4 in/wc at a clearance of about 100 mm from each slot.

6. The chamber of claim 1 wherein the housing includes a length from about 1000 mm to about 2000 mm, and preferably about 1500 mm, a width from about 900 mm to about 1200 mm, and preferably about 1000 mm, and a height from about 350 mm to about 750 mm, and preferably about 500 mm.

7. The chamber of claim 1 wherein the gas intake has a height at least as high as the product path area, and a length at least as long as a length of the product path area.

8. The chamber of claim 1 wherein the gas blower is operable to produce gas into the product path area at a volume of about 1000 cfm to about 2500 cfm, and preferably 2000 cfm.

9. The chamber of claim 1 wherein the first drying zone includes a sufficient volume to hold about 10 cu.ft. of gas such that as the gas blower produces gas to the product path area at a volume of about 2000 cfm, gas circulates about 200 times per minute within the first drying zone.

10. The chamber of claim 1, wherein the first gas inlet includes a heating device disposed and configured to heat gas forced therethrough.

11. The chamber of claim 10 wherein the first drying zone further comprises at least one temperature sensing device connected to an external temperature controller wherein the temperature controller receives an input signal from the temperature sensing device and sends an output signal to control the heating device.

12. The chamber of claim 10 wherein the heating device is operable to heat air to a sufficient temperature to increase a temperature of printed circuit boards from about 100° C. to about 135° C., and preferably to just above about 100° C.

13. The chamber of claim 1 wherein the conveyor conveys printed circuit boards through the chamber at a preferable rate of about 1500 mm/mm.

14. The chamber of claim 1 wherein the housing includes insulation disposed on exterior surfaces.

15. The chamber of claim 1 wherein gas includes air.

16. The chamber of claim 1, wherein each slot is configured to conform gas forced therethrough such that the gas vents to the product path area as a curtain of gas.

17. The chamber of claim 1, wherein each slot has a width of from about 2 mm to about 8 mm and is configured to vent gas at a velocity pressure of from about 0.2 in/wc to about 0.4 in/wc.

18. The chamber of claim 17 wherein the blower and the plurality of slots are configured to produce from about 1000 cfm to about 2500 cfm of gas to the product path area.

19. The chamber of claim 18 wherein the gas blower and the plurality of slots are configured to circulate gas through the first drying zone about 200 times per minute.

20. The chamber of claim 18 wherein the first drying zone further comprises:
(i) a second gas distribution duct defined by the lower wall portion and a second discharge plate, the second discharge plate spaced from and above the lower wall portion and having a length extending along at least a portion of the length of the lower wall portion and a width extending along at least a portion of the width of the lower wall portion, and
(ii) a plurality of slots defined in the second discharge plate and configured to allow gas within the second distribution duct to vent from the second gas distribution duct, each slot being defined in the second discharge plate in an orientation substantially perpendicular to the direction in which the conveyor conveys the printed circuit boards and other electronic assemblies.

21. A chamber for drying circuit boards and other electronic assemblies by convection heating comprising:
a housing defined by an upper wall portion and a lower wall portion, each wall portion having a length and a width, and a first side wall and a second side wall, each side wall connecting the upper wall portion to the lower wall portion; and
at least a first drying zone disposed in the housing, the first drying zone including:
(i) a first gas distribution duct defined by the upper wall portion and a first discharge plate, the first discharge plate spaced from and below the upper wall portion and having a length extending along at least a portion of the length of the upper wall portion and a width extending along at least a portion of the width of the upper wall portion, the first discharge plate defining a plurality of slots configured to vent gas from within the first distribution duct;
(ii) a second gas distribution duct defined by the lower wall portion and a second discharge plate, the second discharge plate spaced from and below the lower wall portion and having a length extending along at least a portion of the length of the lower wall portion and a width extending along at least a portion of the width of the lower wall portion, the second discharge plate, the second discharge plate defining a plurality of slots configured to vent gas from within the first distribution duct;
(iii) a conveyor disposed in a product path area defined between the first discharge plate and the second discharge, the conveyor being spaced from and below the first discharge plate and from and above the second discharge plate to convey circuit boards and electronic assemblies through the product path area from a first end to a second end of the housing; and
(iv) a gas intake means disposed in a side chamber, at least a portion of the gas intake means being adjacent and facing the conveyor and extending along at least a portion of the first drying zone, the side chamber being defined between the first side wall of the housing and the gas intake and extending along an interior length of the housing, the side chamber being in fluid communication with the first gas distribution duct via a first gas inlet and the second gas distribution duct via a second gas inlet, the gas intake means being further disposed and configured to receive gas drawn from the product path area and to vent gas into the side chamber and to blow at least a portion of drawn-in gas through the first gas inlet into the first gas distribution duct and the second gas inlet into the second gas distribution duct and through the plurality of slots to the product path area.

22. The chamber of claim 21 wherein each of the first gas distribution duct and the second gas distribution duct includes a heater disposed and configured such that as drawn-in gas vents into the first and the second distribution ducts drawn-in gas is heated.

23. The chamber of claim 21 wherein each slot defines a width of from about 2 mm to about 8 mm, and preferably about 4 mm.

24. The chamber of claim 21 wherein the gas intake means is configured and arranged to vent gas into the product path area at a volume of about 1000 cfm to about 2500 cfm, and preferably 2000 cfm.

25. The chamber of claim 21 wherein the first drying zone defines an interior volume to contain about 10 cu.ft. of gas such that the gas intake means produces gas to the product path area at a volume of about 2000 cfm and circulates gas within the first drying zone at about 200 times per minute.

26. The chamber of claim 25 wherein each slot is spaced from a surface of the conveyor at a distance of about 100 mm and is further configured to allow gas to vent to the surface of the conveyor at a velocity pressure of from about 0.2 in/wc to about 0.4 in/wc.

27. The chamber of claim 21 wherein each slot defines a cross-section having one of a concave V shape and a Y shape.

* * * * *